(12) United States Patent
Tanabe et al.

(10) Patent No.: US 7,794,857 B2
(45) Date of Patent: Sep. 14, 2010

(54) ORGANIC LIGHT EMITTING DEVICE ARRAY

(75) Inventors: Hiroshi Tanabe, Yokohama (JP); Akihiro Senoo, Kawasaki (JP); Akihito Saitoh, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 489 days.

(21) Appl. No.: 11/917,119

(22) PCT Filed: Mar. 9, 2007

(86) PCT No.: PCT/JP2007/055308

§ 371 (c)(1),
(2), (4) Date: Dec. 10, 2007

(87) PCT Pub. No.: WO2007/111153

PCT Pub. Date: Oct. 4, 2007

(65) Prior Publication Data

US 2009/0033211 A1   Feb. 5, 2009

(30) Foreign Application Priority Data

Mar. 28, 2006   (JP) .................... 2006-087015

(51) Int. Cl.
*H01L 51/30* (2006.01)
(52) U.S. Cl. .................. 428/690; 313/504; 526/259
(58) Field of Classification Search .............. None
See application file for complete search history.

(56) References Cited

U.S. PATENT DOCUMENTS

| | | | |
|---|---|---|---|
| 5,674,597 A | 10/1997 | Fujii et al. | 428/212 |
| 6,965,198 B2 * | 11/2005 | Haase et al. | 313/506 |
| 7,034,454 B2 | 4/2006 | Kawai et al. | 313/504 |
| 2004/0253389 A1 * | 12/2004 | Suzuki et al. | 428/1.1 |
| 2006/0017376 A1 | 1/2006 | Okinaka et al. | 313/504 |
| 2006/0051615 A1 | 3/2006 | Kanno et al. | 428/690 |

FOREIGN PATENT DOCUMENTS

| | | |
|---|---|---|
| JP | 04-297076 | 10/1992 |
| JP | 08-054836 | 2/1996 |
| JP | 10-39791 | 2/1998 |
| JP | 2000-150152 | 5/2000 |
| JP | 2004-091350 | * 3/2004 |
| JP | 2005-26210 | 1/2005 |
| WO | WO 03/022007 A1 | 3/2003 |

OTHER PUBLICATIONS

Zhang et. al. Blue light emitting . . . terfluorenes with carbazole, 2005, Synthetic Metals, 152, pp. 229-232.*
Li, et. al. Synthesis . . . Fluorene/Carbazole Copolymers . . . , 2004, Chemistry Matertials, vol. 16, pp. 2165-2173.*
Wavelength of Colors Document (undated).*
English Translation of JP 2004-09135 (2004).*

* cited by examiner

*Primary Examiner*—D. Lawrence Tarazano
*Assistant Examiner*—Gregory Clark
(74) *Attorney, Agent, or Firm*—Fitzpatrick, Cella, Harper & Scinto

(57) ABSTRACT

The present invention has an object to provide an organic light emitting device array whose power source voltage is not raised. The difference in ionization potential between a host material and a hole transport layer and the difference in electron affinity between a host material and of an electron transport layer are set in a favorable range for all organic light emitting devices which emit light of different colors.

3 Claims, 3 Drawing Sheets

ORGANIC LIGHT EMITTING DEVICE ARRAY

TECHNICAL FIELD

The present invention relates to an organic light emitting device array which has organic EL (organic electroluminescence) devices for each emitting color. More particularly, the present invention relates to an organic light emitting device array for use in displays capable of full color representation.

BACKGROUND ART

Studies on organic EL devices are flourishing. An active matrix drive is used for controlling the light-emission and non-emission of organic EL devices. Japanese Patent Application Laid-Open No. H08-054836 describes power electrodes, organic EL devices and TFTs to control the light-emission and non-emission of organic EL devices.

Japanese Patent Application Laid-Open No. H08-054836 has an object to decrease the voltage applied to a current-control type light emitting device and reduce power consumption. The problem to be solved so far has been thus to reduce power consumption by decreasing the voltage applied to light emitting devices. On the other hand, the present inventors have paid attention to not raising power source voltage. Not raising power source voltage (not set high) is important with a view of achieving power consumption reduction.

Then, the present inventors have extensively studied and noticed the following fact. That is, for not raising the power source voltage (not setting high), setting as equally as possible the driving voltages of light emitting devices for each color is important.

DISCLOSURE OF THE INVENTION

It is an object of the present invention to provide an organic light emitting device array in which the driving voltages of light emitting devices for each color are set as equally as possible.

The present invention provides an organic light emitting device array which includes organic light emitting devices having each emitting color; the organic light emitting devices each including a pair of electrodes, a hole transport layer, a light emitting layer and an electron transport layer; wherein the hole transport layer contacts with the light emitting layer;

the light emitting layer contacts with the electron transport layer; and the light emitting layer has a guest material contained in a host material, wherein each of the organic light emitting devices has an ionization potential difference of not more than 0.2 eV between a material constituting the hole transport layer and the host material and an electron affinity difference of not more than 0.2 eV between a material constituting the electron transport layer and the host material.

In the organic light emitting device array of the present invention, since the driving voltages of light emitting devices for each color can be set as equally as possible (the potential difference among the devices is not more than 1 V), there is no need for the power voltage to be set high.

BEST MODE FOR CARRYING OUT THE INVENTION

The organic light emitting device array according to the present invention has organic light emitting devices having each emitting color; the organic light emitting devices each including a pair of electrodes, a hole transport layer, a light emitting layer and an electron transport layer; wherein the hole transport layer contacts with the light emitting layer;

the light emitting layer contacts with the electron transport layer; and the light emitting layer has a guest material contained in a host material, wherein each of the organic light emitting devices has an ionization potential difference of not more than 0.2 eV between a material constituting the hole transport layer and the host material and an electron affinity difference of not more than 0.2 eV between a material constituting the electron transport layer and the host material.

The host material is a main ingredient constituting a light emitting layer, and the guest material is a sub-ingredient thereof.

Each ratio thereof can be determined based on weight ratio or molar ratio, and an ingredient having a higher ratio is a main ingredient.

More specifically, the organic light emitting device array according to the present invention includes devices to emit light of respective colors of RGB (red, green and blue) and transistors to control the light-emission and non-emission of the each device. An organic light emitting layer disposed between an anode and a cathode includes, at least, a host material and a guest material. The difference in ionization potential between a hole transport layer and a host material of the organic light emitting layer of any organic light emitting device is not more than 0.2 eV.

The difference in electron affinity between an electron transport layer and a host material of an organic light emitting layer of any organic light emitting device is not more than 0.2 eV. The organic light emitting device array according to the present embodiment is an organic light emitting device array characterized by such a constitution.

According to this constitution, there is no need for the power source voltage to be set high. As a result, the organic light emitting device array can also be utilized as a display part of mobile displays, which are especially small-sized.

Figure 1:
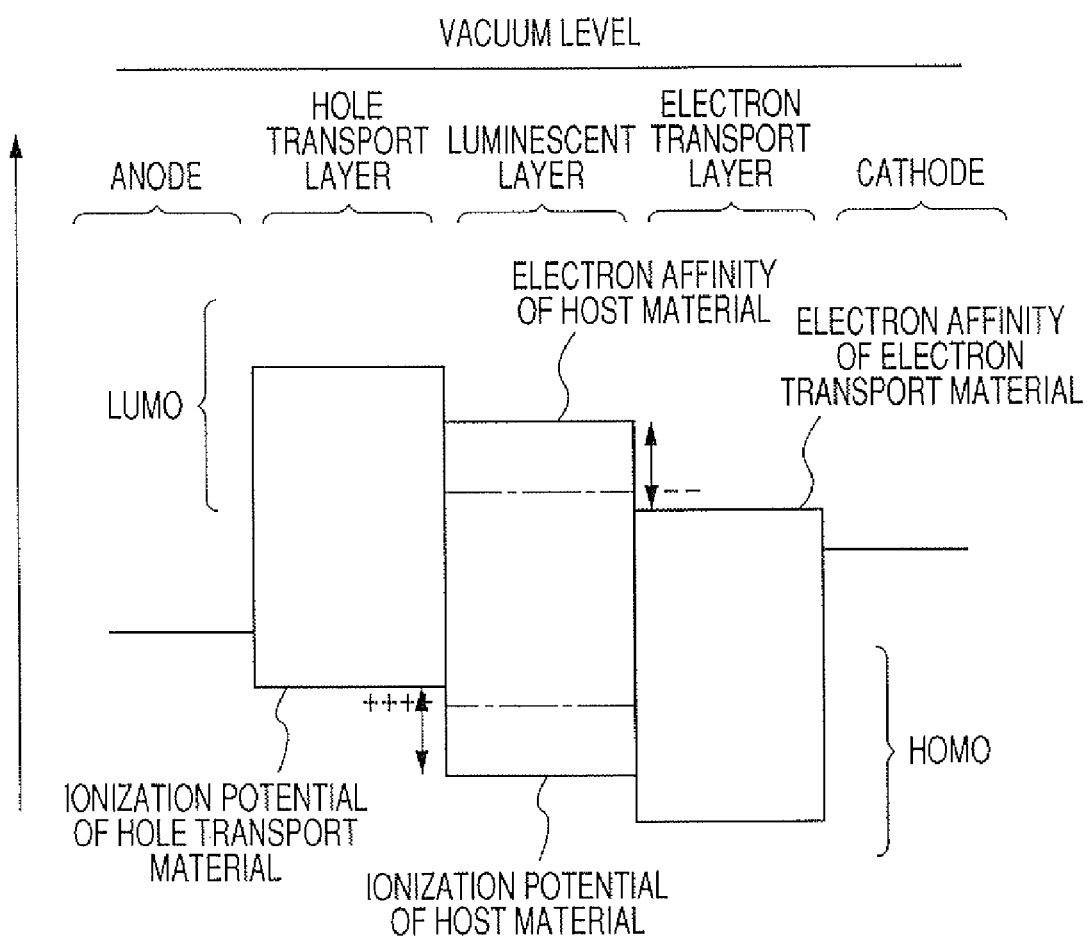
FIG. 1 is an energy diagram of an organic light emitting device of an organic light emitting device array.

FIG. 1 is an energy diagram of an organic light emitting device of an organic light emitting device array according to the present embodiment. The difference in ionization potential between a host material of an organic light emitting layer and a hole transport material and the difference in electron affinity between a host material of an organic light emitting layer and an electron transport material are illustrated with arrows in the figure, respectively.

Light of colors different from each other emitted from organic light emitting devices is emitted from the respective minimum units including an organic light emitting device and a transistor (for example, TFT).

The value of the potential of the minimum unit is determined by a difference between a power source potential (Vcc) and a ground potential (CGND).

The power source potentials have the same value when one electrode (for example, upper electrode) of an opposing pair of electrodes is common in all devices.

When an organic light emitting device array is fabricated, transistors that the respective minimum units have are fabricated so as to have the same properties in the same plane. That is, the transistors are so fabricated that the difference in emitting color does not cause a difference in their properties.

Namely, respective minimum units arranged for each emitting color have the same power source potential, the same ground potential and the same transistor properties.

In an organic light emitting device array according to the present embodiment, the driving potentials of organic light emitting devices arranged for each emitting color are set within 1 V among one another.

In conventional organic light emitting device arrays, although respective minimum units arranged for each emitting color have the same power source potential, the same ground potential, and the same transistor properties, the difference in driving potential is not less than 1 V among respective emitting colors.

In this case, there is a need for determining properties of transistors based on the device which has the highest driving potential. This will be more specifically described.

"Vsd" refers to a source-drain potential of a transistor in a minimum unit, and "Vf" refers to a driving potential of an organic light emitting device; then, the following equation holds.

$$Vcc - CGND = Vf + Vsd = \text{const.}$$

When the driving potential Vf of an organic light emitting device is high, Vsd is low. In such case, when Vsd becomes too low, the transistor cannot allow a desired current to flow due to the V-I characteristic of the transistor.

One example of this includes the early effect.

For allowing a desired current to flow, when the driving potential Vf is high, there is a need for the value of Vcc to be set high.

That is, when the values of Vcc are set to be a common one in all devices, Vcc is set based on a device which emits a color of a high driving voltage.

In other words, even for a device which emits a color of a low driving voltage, the value of Vcc is also set high.

The present inventors have noticed this fact and that by making the driving voltages of respective organic light emitting devices for each emitting color to be as close as possible to one another, setting the power source potential too high can be avoided.

Further, the present inventors have found that the difference in driving voltages of organic light emitting devices from one another is favorably within 1 V.

The difference between the driving voltages of the respective devices is important, and the value of the driving voltage can be any value. The upper limit of the value of the driving voltage is not more than 7 V, and further favorably not more than 4 V in view of the power consumption reduction. The lower limit of the value of the driving voltage is not less than 2 V.

For making the difference between the driving voltages of organic light emitting devices to be as small as possible, the present inventor has paid attention to an organic light emitting layer including at least a host material and a guest material. Then, the present inventors have further paid attention to a host material, a hole transport layer and an electron transport layer of a light emitting device of each color, to the ionization potentials of the host material and the hole transport layer, and to the electron affinity of the host material and the electron transport layer.

The host material means a material which does not emit light with a peak wavelength and which is a main ingredient of a light emitting layer out of the ingredients constituting the light emitting layer.

The main ingredient means an ingredient constituting a light emitting layer in a relatively high content ratio in terms of weight or molar ratio.

The hole transport layer means an organic compound layer disposed on the anode side out of the organic compound layers disposed adjacent to the light emitting layer. The ionization potential and electron affinity of the hole transport layer mean the ionization potential and electron affinity of a main ingredient constituting the hole transport layer.

The electron transport layer means an organic compound layer disposed on the cathode side out of the organic compound layers disposed adjacent to the light emitting layer. The ionization potential and electron affinity of the electron transport layer mean the ionization potential and electron affinity of a main ingredient constituting the electron transport layer.

In the present invention, the difference in ionization potential between a hole transport layer and host materials of organic light emitting layers of all organic light emitting devices is determined.

Herein, the materials of the hole transport layers may be the same or different from one another in all organic light emitting devices.

In the present invention, the difference in electron affinity between an electron transport layer and host materials of organic light emitting layers of all organic light emitting devices is determined.

Herein, the materials of the electron transport layers may be the same or different from one another in all organic light emitting devices.

At least one of the hole transport layer and the electron transport layer may be continuously disposed in organic light emitting devices which emit light of colors different from one another. Namely, the same material may be continuously disposed. Continuously disposing the same material is favorable because it can be simply manufactured.

The hole transport layer favorably further has a function of blocking electrons and/or exitons. In respective organic light emitting devices which emit light of each color, the following relation favorably holds:

(absolute value of the electron affinity of a host material of an organic light emitting layer of any organic light emitting device)−(absolute value of the electron affinity of a hole transport layer) ≧0.2 eV.

The electron transport layer favorably further has a function of blocking holes and/or exitons. Also in respective organic light emitting devices which emit light of each color, the following relation favorably holds:

(absolute value of the ionization potential of a host material of an organic light emitting layer of any organic light emitting device)−(absolute value of the ionization potential of an electron transport layer)≧0.2 eV.

The ionization potential specified in the present invention is defined in terms of an energy necessary for releasing an electron on the level of HOMO (highest occupied molecular orbital) of a compound into the vacuum level. On the other hand, the electron affinity is defined in terms of an energy emitted at the time when an electron on the vacuum level drops to the level of LUMO (lowest unoccupied molecular orbital) and is stabilized.

The ionization potential can be directly measured by UPS (ultraviolet photoelectron spectroscopy) or by a low-energy electron spectrometer (spectrometer's name: AC-1, AC-2, AC-3, made by RIKEN KEIKI, and the like). It can also be determined from the measurement of oxidation potential by cyclic voltammetry.

In the present embodiments, the value of ionization potential was measured by AC-1 of RIKEN KEIKI.

The electron affinity is defined by the following equation:

(electron affinity)=(ionization potential)−(band gap).

The measurement of a band gap is conducted by, for example, vapor-depositing an organic compound on a glass into a thickness of about 50 nm, measuring an absorption spectrum of the vapor-deposited film and converting a wavelength Y (nm) of its absorption edge into X (eV). The conversion equation is X=1239.8/Y.

The electron affinity can also be determined from the measurement of reduction potential by cyclic voltammetry.

In the present embodiments, a method was employed in which the electron affinity was calculated from a measured band gap through photoabsorption and the above-mentioned ionization potential. The measurement of absorption spectrum was performed using a spectrophotometer U-3010 (made by HITACHI HIGH-TECH MANUFACTURING & SERVICE).

A plurality of organic light emitting devices that the organic light emitting device array of the present invention has are favorably arranged two-dimensionally in the same plane. The order of arrangement of the respective organic light emitting devices with respective emitting colors different from one another is suitably established. That is, when an organic light emitting device array capable of full color representation is provided, the respective organic light emitting devices are arranged for each emitting color of red, green and blue. For example, respective organic light emitting devices may be arranged as a set for each emitting color of red, green and blue to constitute a pixel.

Transistors that the organic light emitting device array of the present invention has are favorably thin film transistors (TFT).

The values of gate voltage of the transistors that the organic light emitting device array of the present invention has may be different or the same for respective organic light emitting devices for each color, but are favorably set to be the same. The values of gate voltage are favorably set in common among the organic light emitting devices for each color in organic light emitting device panels to perform gradation representation by a duty drive.

The driving potential of organic light emitting devices that the organic light emitting device array of the present invention has is set as a driving potential to provide an emission brightness, which has been assigned to an organic light emitting device, for example, based on a white light emission obtained by organic light emitting devices which emit different colors. The white light emission in this case has a white color, for example, specified in the range of x=0.33±0.03 and y=0.33±0.03 on the CIE chromaticity coordinate.

Organic light emitting devices that the organic light emitting device array of the present invention has have a pair of electrodes, and at least one of the pair of electrodes is an electrode for extracting light and is favorably transparent.

The organic light emitting device array of the present invention is favorably used as displaying parts of displays for personal computers, televisions and the like. It can also be used as displaying parts for electrographic image formation devices and inkjet printers. It can favorably be used as displaying parts of imaging devices such as digital still cameras and digital video cameras, which have an image pick-up unit.

Organic light emitting devices that the organic light emitting device array of the present invention has may have their layer structure suitably and individually arranged for each emitting color. For example, they may have an electron injection layer and a hole injection layer.

Organic light emitting devices that the organic light emitting device array of the present invention has, when they are arranged on a base material, may have a form in which light is extracted from the base material side or a form in which light is extracted from the opposite side of the base material side.

The organic light emitting device array of the present invention includes, at least, a red light emitting device, a green light emitting device and a blue light emitting device, and besides may further include a white light emitting device.

EXAMPLES

Hereinafter, the present invention will be further specifically described by way of examples, but the present invention is not limited thereto.

Figure 2:
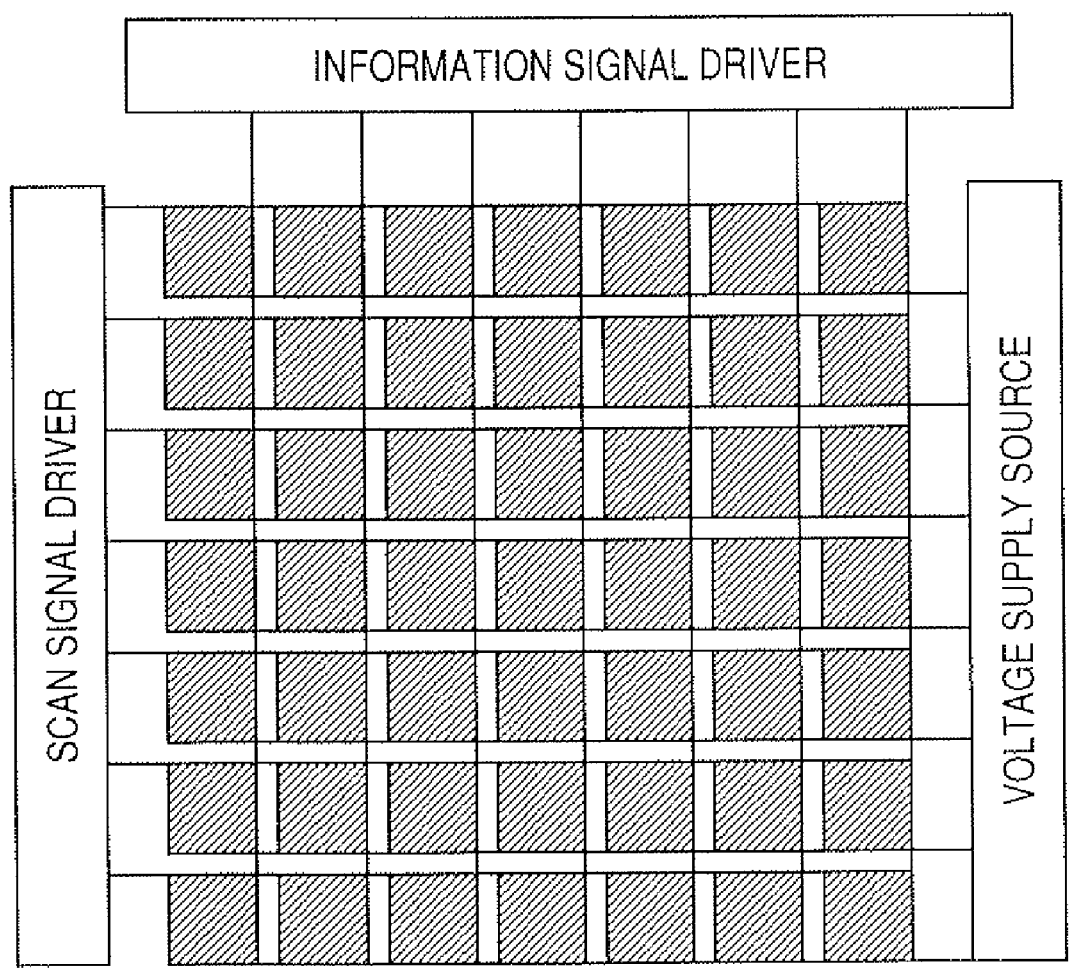
FIG. 2 is an illustrative view illustrating a drive unit of a display of the active matrix type.

FIG. 2 is an illustrative view illustrating a drive unit of a display of the active matrix type. on the periphery of the panel inside, a drive circuit including a scan signal driver and a current supply source, and a display signal input unit (referred to as an image information supply unit), which is an information signal driver, are arranged. Then, they are connected to X-direction scanning lines referred to as gate lines, Y-direction wiring referred to as information line, and current supply lines. The scan signal driver sequentially selects the gate scanning lines, and in synchronization with this, image signals are applied from the information signal driver. Pixels for display are arranged on nodes of gate lines and information lines.

Figure 3:
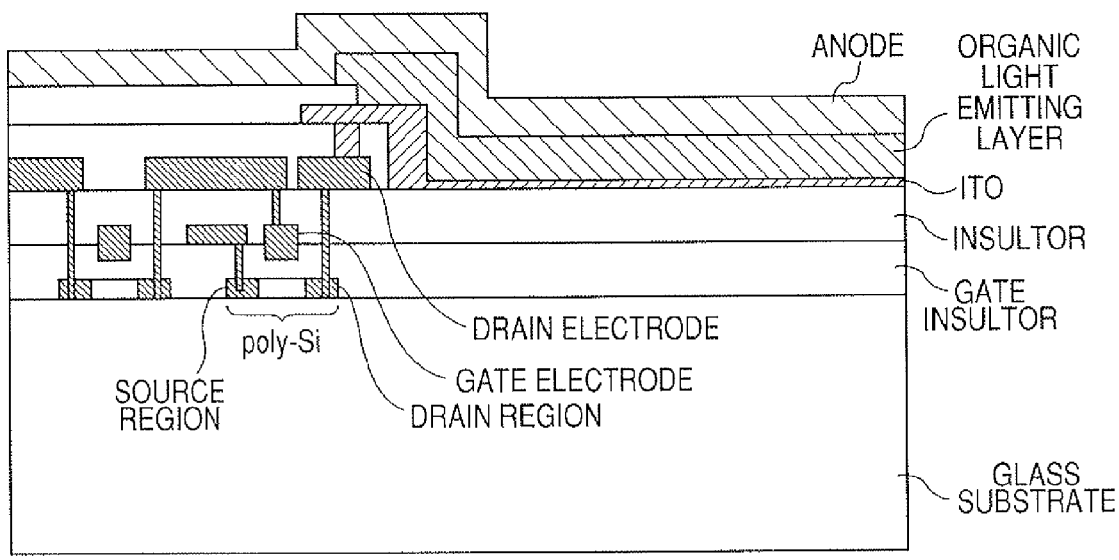
FIG. 3 is a sectional illustrative view illustrating an example of an organic light emitting device of the active driving type using a TFT.

FIG. 3 is a sectional illustrative view of an example of an organic light emitting device of the active driving type using a TFT. A polycrystalline silicon p-Si layer is provided on a glass substrate, and respective necessary impurities are selected and doped in a channel, a drain and a source regions. A gate electrode is provided thereon through a gate insulator film, and a drain electrode and a source electrode to be connected to the drain region and the source region are formed, respectively. The drain electrode and a pixel electrode are connected through a contact hole bored in the intervening insulator film.

An organic light emitting layer is formed on the pixel electrode, and a cathode is then laminated to obtain an organic light emitting device of the active type. In present examples, the pixel electrode was made as an anode by depositing a transparent electrode including Cr and a 60-nm IZO (a compound of zinc oxide and indium oxide) by sputtering. The Cr layer and IZO were patterned to make the anode. A display of 100×100 dots was made with a pixel size of a Cr/IZO anode of 60 μm×90 μm and an interval of 40 μm between pixels.

Example 1

A TFT substrate having the above-mentioned structure was prepared, and a film was deposited by vacuum deposition using Compound 1 represented by the structural formula shown below as a hole transport material. The film was deposited under conditions of a vacuum of 5.0×10-5 Pa and a film deposition rate of 0.1 to 0.2 nm/sec. The thickness of the formed hole transport layer was 20 nm.

(Chemical Formula 1)

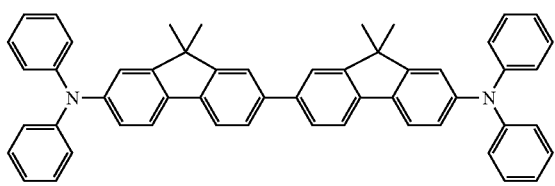

Compound 1 (ionization potential: −5.50 eV, electron affinity: −2.49 eV)

(Formation of a Red Light Emitting Layer)

First, a vapor deposition mask was prepared whose openings were positioned only at lower electrodes which were intended to become red light emitting parts among a large number of lower electrodes to be a constituting element of pixels arranged two-dimensionally, and the lower electrodes and the openings of the vapor deposition mask were aligned.

Compound 2 as a host represented by the structural formula shown below and Compound 3 represented by the structural formula shown below were co-deposited (weight ratio of 93:7) to provide a light emitting layer of 25 nm in thickness.

(Chemical Formula 2)

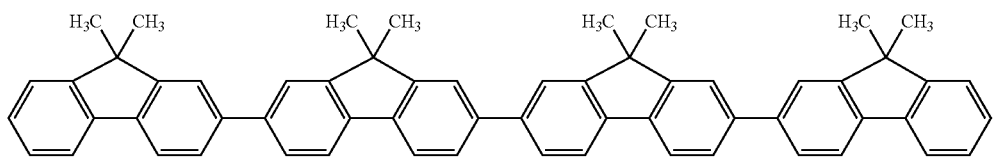

Compound 2 (ionization potential: −5.58 eV, electron affinity: −2.56 eV)

(Chemical Formula 3)

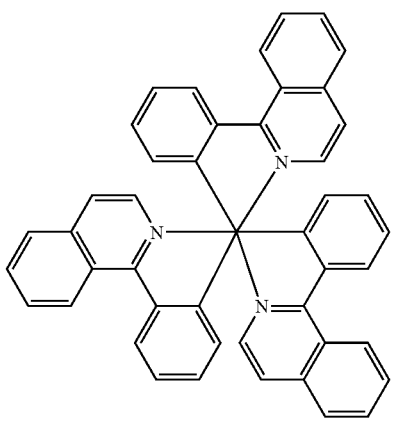

Compound 3

(Formation of a Green Light Emitting Layer)

A vapor deposition mask was prepared whose openings were positioned only at green light emitting parts among a large number of pixels arranged as in the formation of a red light emitting layer.

Then, Compound 4 as a host of a light emitting layer represented below and Compound 5 having light emissivity represented below were co-deposited (weight ratio of 90:10) to provide a light emitting layer of 25 nm.

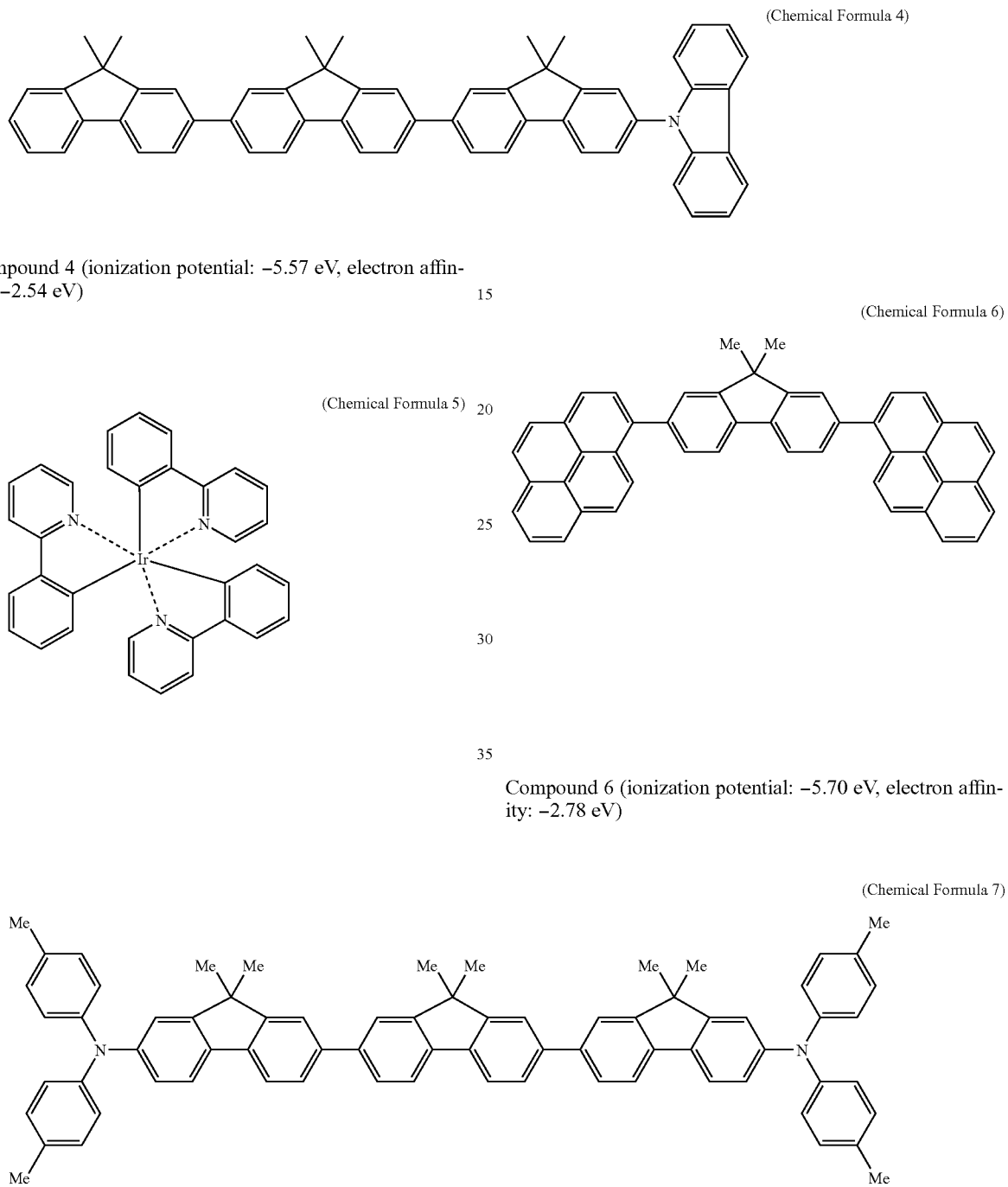

(Chemical Formula 4)

Compound 4 (ionization potential: −5.57 eV, electron affinity: −2.54 eV)

(Chemical Formula 5)

(Chemical Formula 6)

Compound 6 (ionization potential: −5.70 eV, electron affinity: −2.78 eV)

(Chemical Formula 7)

Compound 5

(Formation of a Blue Light Emitting Layer)

A vapor deposition mask was prepared whose openings were positioned only at blue light emitting parts among a large number of pixels arranged as in the formation of a red light emitting layer.

Then, Compound 6 as a host of a light emitting layer represented below and Compound 7 having light emissivity represented below were co-deposited (weight ratio of 90:10) to provide a light emitting layer of 25 nm.

Compound 7

(Formation of an Electron Transport Layer and an Electron Injection Layer)

First, vapor deposition was adapted to be performed on the whole surface of the pixel region by removing the vapor deposition mask.

Compound 8 represented below was deposited as an electron transport layer to provide an electron transport layer of 10 nm.

(Chemical Formula 8)

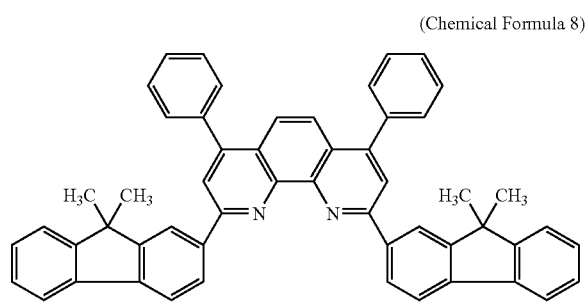

Compound 8 (ionization potential: −5.86 eV, electron affinity: −2.74 eV)

Then, metal cesium enclosed in an alkali dispenser and Compound 8 were co-deposited (weight ratio of 90:10) to provide an electron injection layer of 40 nm.

(Formation of a Cathode)

A substrate on which an organic compound layer has been deposited was moved to a DC sputtering device (OSAKA VACUUM), and a film of indium tin oxide (ITO) of 2,000 angstroms was formed on the organic compound layer by sputtering to provide a transparent cathode for extracting emitted light. As a sputtering gas, a mixed gas of argon and oxygen (in volume ratio, argon:oxygen=200:1) was used; the pressure was 0.3 Pa: and the DC output was 40 W.

As above, an organic EL device of RGB having TFTs was obtained.

After the device was fabricated, the device and a glass substrate were laminated and sealed with a UV curable resin in a glove box of a dew point of not more than −90° C.

Thus, a top emission type RGB full color organic EL panel was obtained in which the hole injection layer, hole transport layer, light emitting layer, electron transport layer, organic compound layer and transparent cathode were provided on the TFT substrate.

The RGB of the full color display were lit to emit white light.

The white color was obtained at a brightness of R:G:B=3:6:1, and the values on the CIE chromaticity coordinate were x=0.3 and y=0.32.

The red light emission was observed with a maximum emission wavelength of 620 nm at an emission brightness of 300 cd/m2, and the voltage applied to the device was 3.6 V.

The green light emission was observed with a maximum emission wavelength of 520 nm at an emission brightness of 600 cd/m2, and the voltage applied to the device was 3.4 V.

The blue light emission was observed with a maximum emission wavelength of 460 nm at an emission brightness of 100 cd/m2, and the voltage applied to the device was 3.2 V.

Characteristics of each of the RGB devices and energy gap values of ionization potentials and electron affinities of light emitting layer/hole transport layer and light emitting layer/electron transport layer, are shown in Table 1.

As described above, the devices of the present examples could be driven at a low voltage of not more than 4 V for all of RGB. The variation of the driving voltages for each of the RGB devices when white light was emitted was 0.4 V, which fell under within 1 V.

The pixels of RGB were driven at a constant current with the above-mentioned initial brightness to measure the brightness half-life times, which were not less than 10,000 h for all colors. Since all the materials used in the present examples had glass transition temperatures of not less than 130° C., the full color display had a high thermal resistance and could endure a long usage in cars.

Example 2

A hole transport layer was deposited on the TFT substrate used in Example 1 using Compound 9 represented by the structural formula shown below as in Example 1. The thickness of the formed hole transport layer was 20 nm.

(Chemical Formula 9)

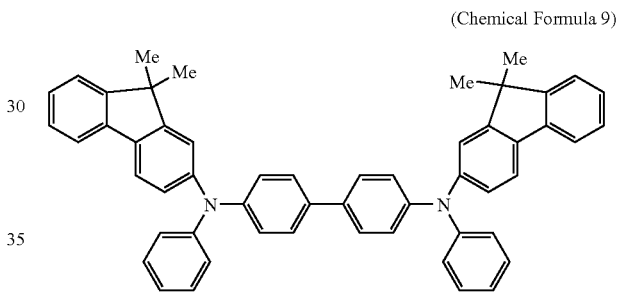

Compound 9 (ionization potential: −5.48 eV, electron affinity: −2.36 eV)

A red light emitting layer and a green light emitting layer were prepared as in Example 1.

(Formation of a Blue Light Emitting Layer)

A mask for blue was put, and Compound 2 used in Example 1 was used as a host for blue. Compound 2 was co-deposited with Compound 7 having light emissivity as a dopant used in Example 1 (weight ratio of 90:10) to provide a light emitting layer of 25 μm.

(Formation of an Electron Transport Layer and an Electron Injection Layer)

As in Example 1, after the deposition mask was removed, and vapor deposition was adapted to be performed on the whole surface of the pixel region, Compound 10 represented by the structural formula shown below was deposited to provide an electron transport layer of 10 nm.

(Chemical Formula 10)

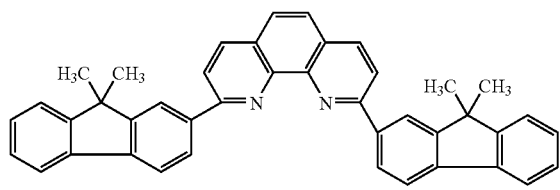

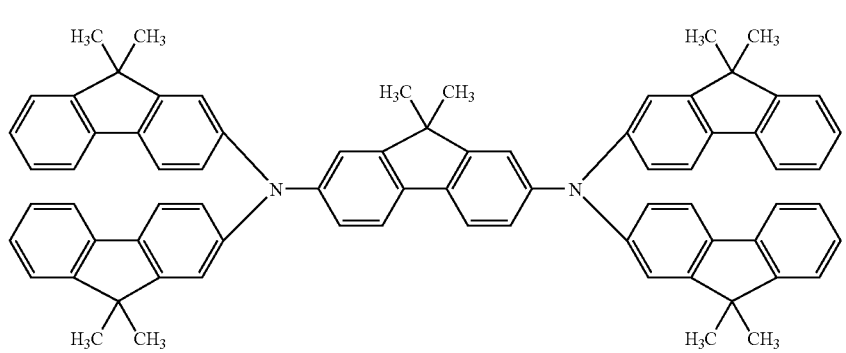

(Chemical Formula 11)

Further, metal cesium enclosed in an alkali dispenser and Compound 10 were co-deposited (weight ratio of 90:10) to provide an electron injection layer of 40 nm.

Then, a cathode was provided as in Example 1, and sealing was performed as in Example 1, thereby obtaining an organic EL display whose electron transport layer was common among RGB. Characteristics of the obtained devices and values of the band gaps are shown in Table 1.

The ionization potential difference of light emitting layer/hole transport layer and the electron affinity difference of light emitting layer/electron transport layer both fell under within 0.1 eV, exhibiting very smooth injection of carriers into the light emitting layer.

Since the electron affinity of the hole transport layer was shallower than that of the light emitting layer by not less than 0.2 eV, electrons injected into the light emitting layer were efficiently recombined in the light emitting layer without leaking into the hole transport layer, exhibiting a high emission efficiency.

On the other hand, since the ionization potential of the light emitting layer was deeper than that of the electron transport layer by not less than 0.2 eV, holes injected into the light emitting layer were efficiently recombined in the light emitting layer without leaking into the electron transport layer, exhibiting a high emission efficiency.

From the above result, the driving voltage applied on the devices when the devices are made to emit light in the same brightness is further reduced as compared with Example 1, enabling suppression of the power of the power source of the TFT. Since the voltage difference between RGB decreased to 0.1 V, the brightness variation when the TFTs are driven is remarkably reduced. The values on the CIE chromaticity coordinate when RGB were made to emit with the brightnesses in Table 1 were x=0.31 and y=0.34, which was a favorable white color.

Comparative Example 1

An organic EL panel similar to that of Example 1 was fabricated, but using Compound 11 represented by the structural formula shown below in place of the hole transport material used in Example 1.

Compound 11 (ionization potential: −5.35 eV, electron affinity: −2.27 eV)

Characteristics of the obtained devices and the values of the band gaps are shown in Table 1. The gaps of ionization potential between the hole transport layer and the light emitting layer enlarged, and consequently the hole injectability decreased, thereby raising the voltage and increasing the voltage variation among RGB (maximum of 1.1 V).

Comparative Example 2

An organic EL panel similar to that of Example 1 was fabricated, but using Compound 12 represented by the structural formula shown below in place of the electron transport material used in Example 1.

(Chemical Formula 12)

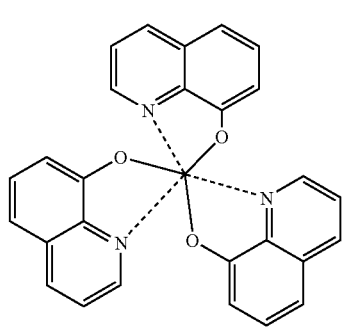

Compound 12 (ionization potential: −5.70 eV, electron affinity: −2.92 eV)

Characteristics of the obtained devices and the band gaps are shown in Table 1. The gaps of electron affinity between the electron transport layer and the light emitting layer enlarged, and consequently the electron injectability into the light emitting layer decreased, thereby remarkably raising the voltage. Further, since the gap of ionization potential between the light emitting layer and the electron transport layer was small, holes leaked into the electron transport layer, thereby decreasing the emission efficiency. As a result, the voltage variation among RGB when the devices were made to emit white light exceeded 1 V (maximum of 1.3 V).

b) a material emitting green color of the formula

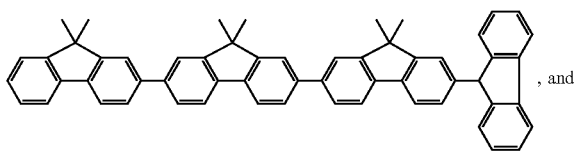

, and

TABLE 1

|  |  | Ionization potential gap (eV) between hole transport layer and light emitting layer | Electron affinity gap (eV) between electron transport layer and light emitting layer | Driving voltage (V) R: 300 cd/m2 G: 600 cd/m2 B: 100 cd/m2 | Electron affinity gap (eV) between hole transport layer and light emitting layer | Ionization potential gap (eV) between electron transport layer and light emitting layer | Light emission efficiency (cd/A) |
|---|---|---|---|---|---|---|---|
| Example 1 | R | 0.08 | 0.18 | 3.6 | 0.07 | 0.30 | 16.3 |
|  | G | 0.07 | 0.20 | 3.4 | 0.05 | 0.29 | 13.5 |
|  | B | 0.20 | 0.04 | 3.2 | 0.29 | 0.18 | 4.5 |
| Example 2 | R | 0.10 | 0.07 | 3.2 | 0.24 | 0.22 | 20.3 |
|  | G | 0.09 | 0.09 | 3.1 | 0.24 | 0.22 | 15.4 |
|  | B | 0.10 | 0.07 | 3.1 | 0.24 | 0.22 | 4.1 |
| Comparative Example 1 | R | 0.23 | 0.18 | 4.4 | 0.29 | 0.28 | 16.0 |
|  | G | 0.22 | 0.20 | 3.9 | 0.27 | 0.29 | 12.0 |
|  | B | 0.23 | 0.18 | 3.7 | 0 29 | 0.28 | 3.0 |
| Comparative Example 2 | R | 0.08 | 0.36 | 6.8 | 0.07 | 0.12 | 8.0 |
|  | G | 0.07 | 0.38 | 5.5 | 0.05 | 0.13 | 8.2 |
|  | B | 0.08 | 0.36 | 6.1 | 0.07 | 0.12 | 2.2 |

This application claims priority from Japanese Patent Application No. 2006-087015 filed Mar. 28, 2006, which is hereby incorporated by reference herein.

The invention claimed is:

1. An organic light emitting device array comprising organic light emitting devices having each emitting color, the organic light emitting devices each comprising a pair of electrodes, a hole transport layer, a light emitting layer and an electron transport layer, wherein
   the hole transport layer contacts the light emitting layer and is continuously disposed in all the organic light emitting devices;
   the light emitting layer contacts the electron transport layer;
   the electron transport layer is continuously disposed in all the organic light emitting devices;
   the light emitting layer has a guest material contained in a host material, wherein each of the organic light emitting devices has
   (i) an ionization potential difference of not more than 0.2 eV between a material constituting the hole transport layer and the host material and
   (ii) an electron affinity difference of not more than 0.2 eV between a material constituting the electron transport layer and the host material; and
   the host material comprises
   a) a material emitting a red color of the formula

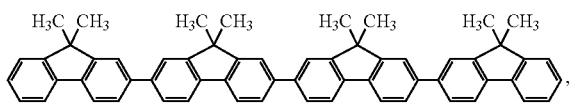

c) a material emitting blue color of the formula

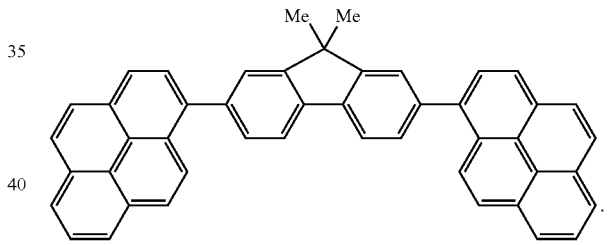

2. The organic light emitting device array according to claim 1, wherein the absolute value of the electron affinity of the hole transport layer and the absolute value of the electron affinity of the host material of the organic light emitting layer of any of the organic light emitting devices satisfy (absolute value of the electron affinity of the host material of the organic light emitting layer of any of the organic light emitting devices)−(absolute value of the electron affinity of the hole transport layer)≧0.2 eV.

3. The organic light emitting device array according to claim 1, wherein the absolute value of the ionization potential of the electron transport layer and the absolute value of the ionization potential of the host material of the organic light emitting layer of any of the organic light emitting devices satisfy (absolute value of the ionization potential of the electron transport layer)−(absolute value of the ionization potential of the host material of the organic light emitting layer of any of the organic light emitting devices)≧0.2 eV.

* * * * *